(12) United States Patent
Huang et al.

(10) Patent No.: US 10,709,048 B2
(45) Date of Patent: Jul. 7, 2020

(54) SYSTEM AND METHOD FOR ASSEMBLING ELECTRONIC COMPONENTS

(71) Applicant: Delta Electronics, Inc., Taoyuan (TW)

(72) Inventors: Yu-Ru Huang, Taoyuan (TW); Hung-Wen Chen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 105 days.

(21) Appl. No.: 16/000,197

(22) Filed: Jun. 5, 2018

(65) Prior Publication Data
US 2019/0174661 A1  Jun. 6, 2019

(30) Foreign Application Priority Data

Dec. 1, 2017  (TW) .............................. 106142121 A

(51) Int. Cl.
| | | |
|---|---|---|
| *H05K 13/04* | (2006.01) | |
| *H05K 13/08* | (2006.01) | |
| *G06T 7/70* | (2017.01) | |

(52) U.S. Cl.
CPC ........... *H05K 13/0413* (2013.01); *G06T 7/70* (2017.01); *H05K 13/08* (2013.01);
(Continued)

(58) Field of Classification Search
CPC . G06T 2207/10004; G06T 2207/30141; G06T 7/70; H05K 13/0413; H05K 13/08; H05K 13/0813
See application file for complete search history.

(56) References Cited

U.S. PATENT DOCUMENTS

| | | | | |
|---|---|---|---|---|
| 5,175,775 A | * | 12/1992 | Iwaki ..................... | G06K 9/748 |
| | | | | 359/561 |
| 2002/0140948 A1 | * | 10/2002 | Rudd ....................... | G06T 7/12 |
| | | | | 356/601 |

(Continued)

FOREIGN PATENT DOCUMENTS

| | | |
|---|---|---|
| CN | 101060770 A | 10/2007 |
| JP | S63275200 A | 11/1988 |

(Continued)

OTHER PUBLICATIONS

Taiwanese Office Action and Search Report based on corresponding Application No. 106142121; dated May 30, 2018.

(Continued)

*Primary Examiner* — Anner N Holder
(74) *Attorney, Agent, or Firm* — Muncy, Geissler, Olds & Lowe, P.C.

(57) ABSTRACT

An electronic-component assembly system is provided in the invention. The electronic-component assembly system includes a gripping device, a light-source device, a photographing device, and an image-processing device. The gripping device grips an electronic component, wherein the electronic component includes at least one pin. The light-source device includes a light source and emits light of the light source. The photographing device senses the light and generates a plurality of first one-dimensional images corresponding to the pins at different rotation angles. The image-processing device is coupled to the photographing device to receive the plurality of first one-dimensional images. The image-processing device transforms the plurality of first one-dimensional images into a two-dimensional image, generates adjustment information according to the two-dimensional image, and provides adjustment information to the gripping device, wherein the gripping device adjusts the (Continued)

angle and position of the electronic component according to the adjustment information.

19 Claims, 6 Drawing Sheets

(52) U.S. Cl.
CPC .................... *H05K 13/0813* (2018.08); *G06T 2207/10004* (2013.01); *G06T 2207/30141* (2013.01)

(56) References Cited

U.S. PATENT DOCUMENTS

| | | | | |
|---|---|---|---|---|
| 2007/0116351 | A1* | 5/2007 | Duquette | H05K 13/0812 382/151 |
| 2014/0130341 | A1* | 5/2014 | Hung | H05K 13/0015 29/593 |

FOREIGN PATENT DOCUMENTS

| | | |
|---|---|---|
| JP | H01236700 A | 9/1989 |
| JP | 2899121 B2 | 3/1999 |
| TW | 201407535 A | 2/2014 |

OTHER PUBLICATIONS

Japanese Office Action with English Language Translation based on corresponding Application No. 2018-091708; dated Apr. 16, 2019.
Chinese Office Action and Search Report based on corresponding Application No. 201711251344.X; dated Nov. 28, 2019.

\* cited by examiner

SYSTEM AND METHOD FOR ASSEMBLING ELECTRONIC COMPONENTS

CROSS REFERENCE TO RELATED APPLICATIONS

This Application claims priority of TW Patent Application No. 106142121 filed on Dec. 1, 2017, the entirety of which is incorporated by reference herein.

BACKGROUND OF THE INVENTION

Field of the Invention

The invention relates to technology for assembling electronic components, and more particularly, to technology for transforming a plurality of one-dimensional images corresponding to the pin (or pins) of a component (or element) at different rotation angles into a two-dimensional image, and adjusting the position of the component according to the two-dimensional image.

Description of the Related Art

In the traditional process of manufacturing a printed circuit board (PCB), Through Hole Technology (THT) defines the standards and methods to insert the pin (or pins) of electronic components into a PCB. However, due to the lack of high-precision inspection technology for automatic insertion, the electronic components are usually inserted into the PCB manually.

In order to fulfill the automatic through-hole component assembly, a photographing device (e.g., a camera) may need to be configured in the machine station to photograph the pins of the electronic components to generate a pin distribution image. According to the pin distribution image, the machine station may determine a displacement error and a rotation error of the electronic components when the gripping device randomly grips the electronic components. By taking into account the displacement error and the rotation error, the gripping device is able to calibrate the insertion coordinates of the electronic components immediately and to complete the insertion of the electronic components accurately.

It is essential that the pins of the electronic component can be accurately aligned with the corresponding holes on the PCB. Therefore, the definition of the pin distribution image is crucial for the insertion of the electronic components when employing automatic through-hole component assembly. By using traditional photography, however, the illumination light is usually scattered due to the slender structures and metal surfaces of the pins of the electronic components. As a consequence, the pin distribution image cannot be accurately reproduced by the light-sensor module of the photographing device. The problem may lead to a distortion of the pin distribution image generated by the photographing device, and as a result, the electronic component will not be accurately inserted into the PCB, and the efficiency of the automatic through-hole component assembly will be worse.

BRIEF SUMMARY OF THE INVENTION

An electronic-component assembly system and a method for assembling electronic components are provided to overcome the problems mentioned above.

An embodiment of the invention provides an electronic-component assembly system. The electronic-component assembly system comprises a gripping device, a light-source device, a photographing device and an image-processing device. The gripping device grips an electronic component, wherein the electronic component comprises at least one pin. The light-source device comprises a light source and emits light of the light source. The photographing device senses the light, and generates a plurality of first one-dimensional images corresponding to the pins at different rotation angles. The image-processing device is coupled to the photographing device to receive the plurality of first one-dimensional images, and transforms the plurality of first one-dimensional images into a two-dimensional image, and generates adjustment information according to the two-dimensional image and provides the adjustment information to the gripping device, wherein the gripping device adjusts the angle and position of the electronic component according to the adjustment information.

An embodiment of the invention provides a method for assembling electronic components. The method for assembling electronic components comprises the steps of gripping an electronic component, wherein the electronic component comprises at least one pin; moving the pins of the electronic component between a light-source device and a photographing device; emitting light of a light source to the photographing device; sensing the light to generate a plurality of first one-dimensional images corresponding to the pins of the electronic component at different rotation angles; transforming the plurality of first one-dimensional images into a two-dimensional image; generating adjustment information according to the two-dimensional image; and adjusting the angle and position of the electronic component according to the adjustment information.

Other aspects and features of the invention will become apparent to those with ordinary skill in the art upon review of the following descriptions of specific embodiments of electronic-component assembly system and method for assembling electronic components.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
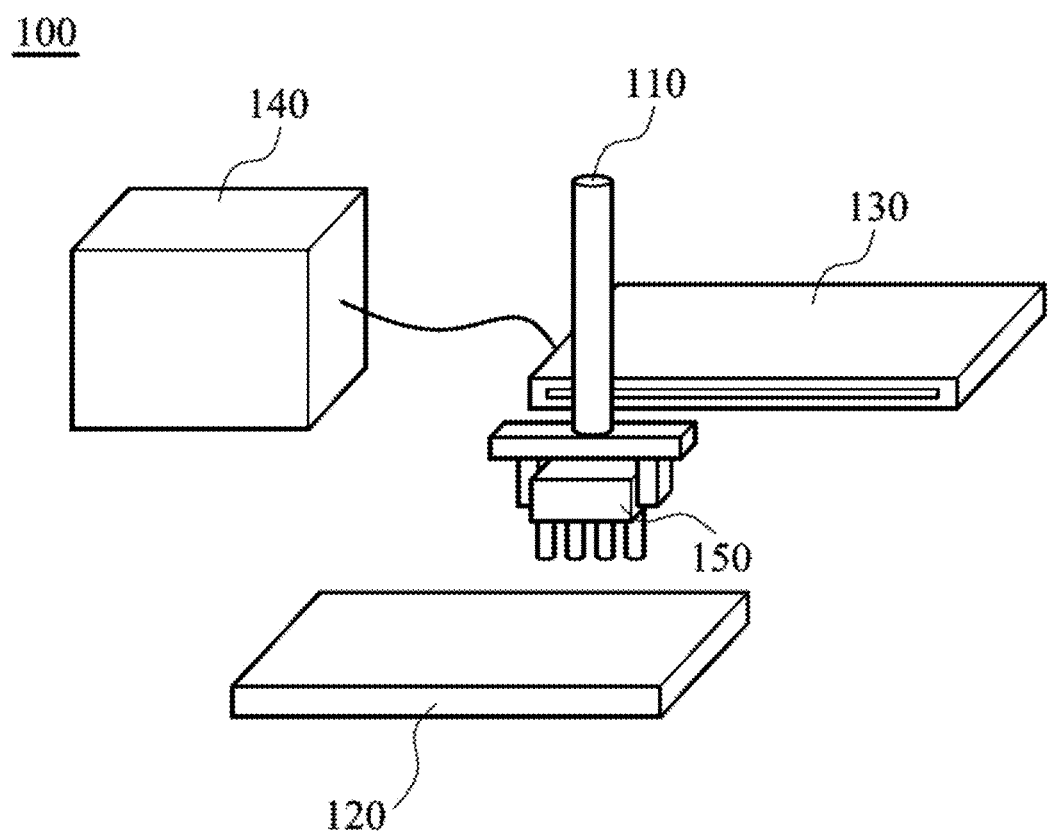
FIG. 1 is a block diagram of an electronic-component assembly system 100 according to an embodiment of the invention.

FIG. 1 is a block diagram of an electronic-component assembly system 100 according to an embodiment of the invention. In an embodiment of the invention, the electronic-component assembly system 100 may be used in a moving carrier. As shown in FIG. 1, the electronic-component assembly system 100 comprises a gripping device 110, a light-source device 120, a photographing device 130 (or an image-capturing device e.g. a camera) and an image-processing device 140. FIG. 1 presents a simplified block diagram in which only the elements relevant to the invention are shown. However, the invention should not be limited to what is shown in FIG. 1. The electronic-component assembly system 100 may also comprise other elements.

In an embodiment of the invention, the gripping device 110, light-source device 120 and the photographing device 130 are configured on a moving carrier, e.g. a robotic arm, and the image-processing device 140 is configured on a machine station. According to another embodiment of the invention, the gripping device 110 is configured on a moving carrier, and the light-source device 120, photographing device 130, and image-processing device 140 are configured on a machine station. According to an embodiment of the invention, the electronic-component assembly system 100 further comprises a controlling device (not shown in figures) to control the gripping device 110, light-source device 120, and photographing device 130.

According to an embodiment of the invention, the gripping device 110 may be a gripper or a suction nozzle, but the invention should not be limited thereto. The gripping device 110 may shift and rotate the electronic components.

In an embodiment of the disclosure, the light-source device 120 is deposited in parallel with the photographing device 130 (as shown in FIG. 1), i.e. the light generated by a light source of the light-source device 120 may be emitted to the photographing device 130 in parallel, but the invention is not limited thereto. According to an embodiment of the invention, the light of the light source which is emitted by the light-source device 120 is a visible light or a non-visible light, wherein the non-visible light may comprise X-ray, ultraviolet light, infrared light or electromagnetic wave, but the invention should not be limited thereto.

When an electronic component 150 is inserted into the circuit board, the gripping device 110 may grip the electronic component 150 and move the electronic component 150 to ensure that the pins of the electronic component 150 are located between the light-source device 120 and the photographing device 130. According to the embodiments of the invention, the electronic component 150 may comprise at least one pin.

When the electronic component 150 is moved into position between the light-source device 120 and the photographing device 130, the light-source device 120 may emit light of a light source to the pins of the electronic component 150 and the photographing device 130. When the photographing device 130 senses the light, the photographing device 130 may photograph the pins of the electronic component 150 to generate one-dimensional images that correspond to the pins of the electronic component 150. According to the embodiments of the invention, the photographing device 130 may generate the one-dimensional images corresponding to the pins of the electronic component 150 at different rotation angles. According to the embodiments of the invention, the number of rotation turns may be one or a half. Namely, at the range of half-turn or one turn, the photographing device 130 may photograph the pins of the electronic component 150 every default degrees to generate several one-dimensional images.

According to an embodiment of the invention, the gripping device 110 may rotate the electronic component 150 to ensure that the photographing device 130 is able to photograph the pins of the electronic component 150 at different angles to generate one-dimensional images that correspond to the pins of the electronic component 150 at different rotation angles. In the embodiment, the electronic device 150 may be rotated by a default angle (e.g. 1 degree) per rotation by the gripping device 110, and the photographing device 130 may photograph the pins of the electronic component 150 to generate the one-dimensional images at different rotation angles.

According to another embodiment of the invention, the photographing device 130 may rotate automatically to photograph the pins of the electronic component 150 at different degrees to generate one-dimensional images corresponding to the pins of the electronic component 150 at different rotation angles. In the embodiment of the invention, the photographing device 130 may rotate a default degree (e.g. 1 degree) per rotation, and the photographing device 130 may photograph the pins of the electronic component 150 to generate the one-dimensional images at different rotation angles. In addition, in the embodiment, when the photographing device 130 rotates, the light-source device 120 may rotate at the same time. That is to say, the relative positions of the light-source device 120 and the photographing device 130 may be maintained in parallel relationship (as shown in FIG. 1). Therefore, when the photographing device 130 rotates, the light-source device 120 may also rotate by a different number of degrees to emit the light of light source to the pins of the electronic component 150.

After the photographing device 130 generates a plurality of one-dimensional images corresponding to the pins of the electronic component 150 at different rotation angles, the photographing device 130 may transmit the one-dimensional images to the image-processing device 140. The image-processing device 140 may transform the one-dimensional images from the photographing device 130 into a two-dimensional image, and generate adjustment information according the two-dimensional image. Then, the image-processing device 140 may transmit the adjustment information to the gripping device 110. The gripping device 110 may adjust the position and angle of the electronic component 150 according to the adjustment information to accurately insert the pins of the electronic component 150 into the printed circuit board. Details of the process used by the image-processing device 140 to transform one-dimensional images into a two-dimensional image are described below.

Figure 2A:
FIGS. 2A-2C are schematic diagrams illustrating the result of a normalization process on a one-dimensional image according to an embodiment of the invention.
Figure 2B:
Figure 2C:
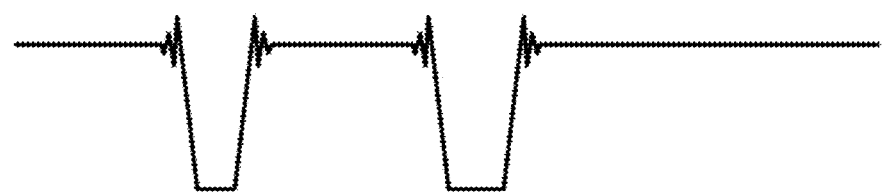

According to an embodiment of the invention, when the image-processing device 140 receives the one-dimensional images from the photographing device 130, the image-processing device 140 may perform a normalization process to generate a plurality of normalized images from the one-dimensional images. FIGS. 2A-2C are provided for illustration below.

FIGS. 2A-2C are schematic diagrams illustrating the result of a normalization process on a one-dimensional image according to an embodiment of the invention. FIG. 2A shows a signal strength diagram corresponding to an original one-dimensional image which is generated by the photographing device 130 when no electronic component is placed between the light-source device 120 and the photographing device 130, and the light-source device 120 emit the light of the light source to the photographing device 130. That is to say, before the insertion of the electronic components, the photographing device 130 may generate an original one-dimensional image in advance, and the original one-dimensional image may be stored in the image-processing device 140 (i.e. a storage device (not shown in figures) of the image-processing device 140). FIG. 2B shows a signal strength diagram corresponding to a one-dimensional image which is generated by the photographing device 130 when an electronic component is placed between the light-source device 120 and the photographing device 130, and the light-source device 120 emits the light of the light source to the photographing device 130. As shown in FIG. 2B, the places where the light is blocked by the pins of the electronic component may correspond to weaker signal strength. FIG. 2C shows a signal strength diagram corresponding to the signal strength which is generated by the strength of the one-dimensional image divided by the strength of the original one-dimensional image. As shown in FIG. 2C, when the image-processing device 140 obtains the strength values corresponding to the one-dimensional image, the image-processing device 140 may divide the strength values corresponding to the one-dimensional image by the strength values corresponding to the original one-dimensional image (i.e. the normalization process) to eliminate the effect of the background signals to generate a normalized image. Therefore, according to the normalization process, the image-processing device 140 may transform a plurality of one-dimensional images corresponding to different rotation angles to a plurality of normalized images.

Figure 3A:
FIGS. 3A-3C are schematic diagrams illustrating the result of a binarization process on a normalized image according to an embodiment of the invention.
Figure 3B:
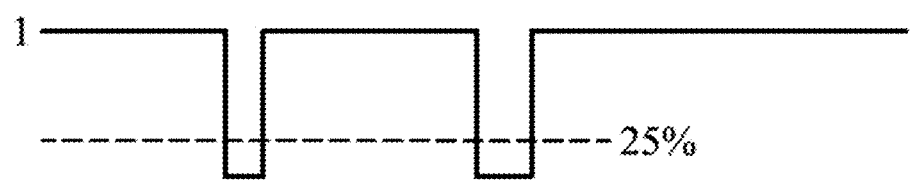
Figure 3C:
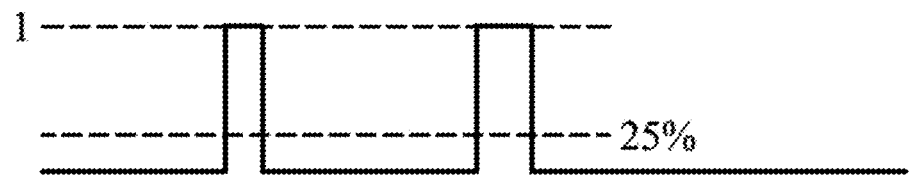

According to an embodiment of the invention, after the image-processing device 140 obtains a plurality of the normalized images, the image-processing device 140 may perform a binarization process on the normalized images based on a first threshold. FIGS. 3A-3C are provided for illustration below.

FIGS. 3A-3C are schematic diagrams illustrating the result of a binarization process on a normalized image according to an embodiment of the invention. As shown in FIGS. 3A-3C, in the binarization process, the image-processing device 140 may perform a positive film process (as shown in FIG. 3B) or a negative film process (as shown in FIG. 3C) on the normalized image (as shown in FIG. 3A) based on a first threshold. For example, if the first threshold is set to a strength value corresponding to 25% of the signal strength of the normalized image (i.e. a strength value of 0.25), when the positive film process (as shown in FIG. 3B) is performed in the binarization process, the image-processing device 140 may set the signal strength (whose strength value is greater than 0.25) to 1, and set the signal strength (whose strength value is less than or equal to 0.25) to 0; and when the negative film process (as shown in FIG. 3C) is performed in the binarization process, the image-processing device 140 may set the signal strength (whose strength value is less than 0.25) to 1, and set the signal strength (whose strength value is greater than or equal to 0.25) to 0. Accordingly, the image-processing device 140 may perform a binarization process on a plurality of normalized images to generate a positive film image or a negative film image that corresponds to the normalized images. It should be noted that the first threshold may be set to other values according different situations, and the invention should not be limited thereto.

Figure 4A:
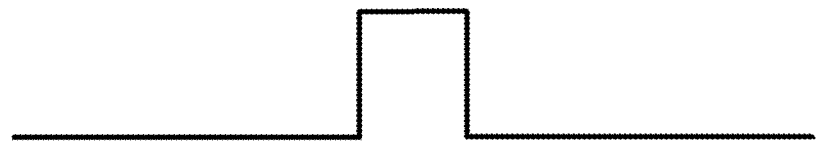
FIGS. 4A-4B are schematic diagrams illustrating the result of a Fourier transform process on a normalized image which has been processed by the binarization process according to an embodiment of the invention.
Figure 4B:

According to an embodiment of the invention, after the image-processing device 140 obtains normalized images which have been processed by the binarization process, the image-processing device 140 may perform a Fourier transform on the normalized images which have been processed by the binarization process. FIGS. 4A-4B are provided for illustration below.

FIGS. 4A-4B are schematic diagrams illustrating the result of a Fourier transform process on a normalized image which has been processed by the binarization process according to an embodiment of the invention. As shown in FIGS. 4A-4B, the image-processing device 140 may perform a Fourier transform on a normalized image (as shown in FIG. 4A) which has been processed by the binarization process to generate an image (as shown in FIG. 4B).

Figure 4C:
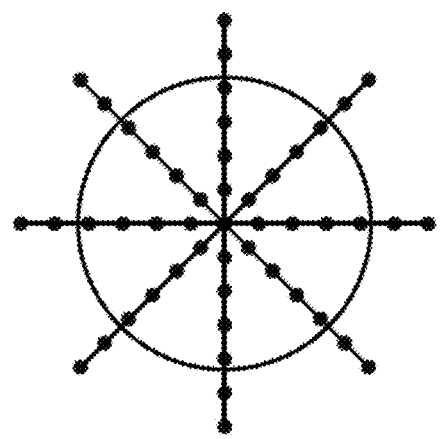
FIG. 4C is a schematic diagram illustrating frequency distribution in a two-dimensional space according to an embodiment of the invention.

FIG. 4C is a schematic diagram illustrating frequency distribution in a two-dimensional space according to an embodiment of the invention. As shown in FIG. 4C, according to an embodiment of the invention, after the image-processing device 140 performs a Fourier transform on the normalized images which have been processed by the binarization process, the image-processing device 140 may sum up the images (corresponding to different rotation angles) processed by the Fourier transform to generate a two-dimensional spatial frequency distribution diagram corresponding to the pins of the electronic component.

Figure 5:
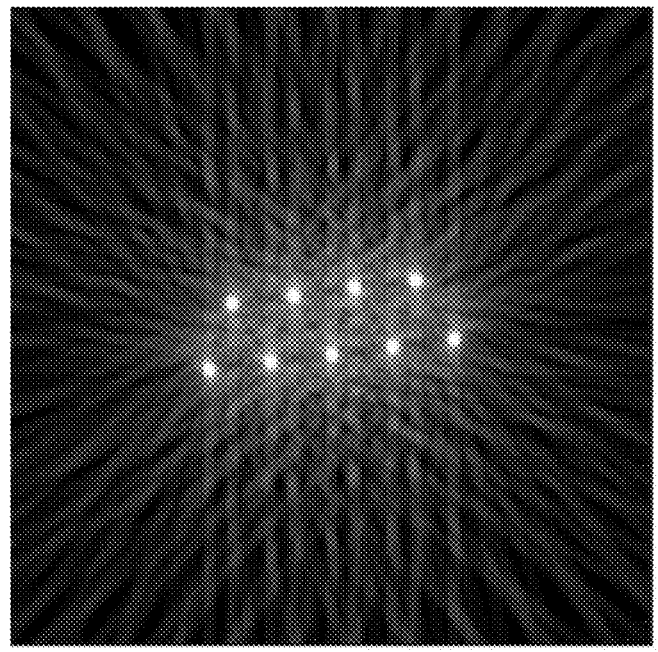
FIG. 5 is a schematic diagram illustrating the result of an inverse Fourier transform on a two-dimensional spatial frequency distribution diagram according to an embodiment of the invention.

FIG. 5 is a schematic diagram illustrating the result of an inverse Fourier transform on a two-dimensional spatial frequency distribution diagram according to an embodiment of the invention. As shown in FIG. 5, according to an embodiment of the invention, the image-processing device 140 may perform an inverse Fourier transform on the two-dimensional spatial frequency distribution diagram to generate a two-dimensional image corresponding to the pins of the electronic component.

According to another embodiment of the invention, the image-processing device 140 may perform a filter process on the images which have been processed by the Fourier transform, and then the image-processing device 140 may sum up the filtered images to generate a two-dimensional spatial frequency distribution diagram corresponding to the pins of the electronic component. Then, the image-processing device 140 may perform an inverse Fourier transform on the two-dimensional spatial frequency distribution diagram to generate a two-dimensional image corresponding to the pins of the electronic component.

According to another embodiment of the invention, the image-processing device 140 may perform a filter process on the images which have been processed by the Fourier transform, and then the image-processing device 140 may perform an inverse Fourier transform on the filtered images to generate a plurality of two-dimensional spatial distribution diagrams corresponding to the pins of the electronic component. Then, the image-processing device 140 may sum up the two-dimensional spatial distribution diagrams to generate a two-dimensional image.

According to another embodiment of the invention, the image-processing device 140 may perform an inverse Fourier transform directly on the images which have been processed by the Fourier transform to generate a plurality of two-dimensional spatial distribution diagrams corresponding to the pins of the electronic component. Then, the image-processing device 140 may sum up the two-dimensional spatial distribution diagrams to generate a two-dimensional image.

Figure 6:
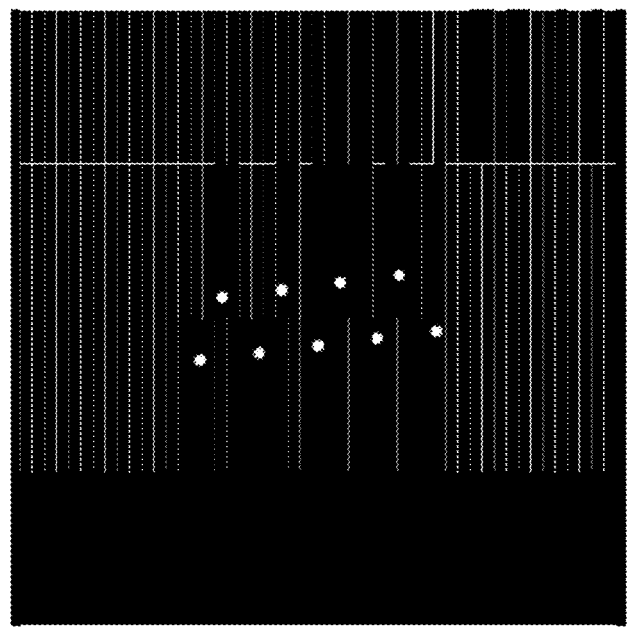
FIG. 6 is a schematic diagram illustrating a reconstructed image according to an embodiment of the invention.

According to an embodiment of the invention, after the image-processing device 140 obtains the two-dimensional image, the image-processing device 140 may perform a binarization process on the two-dimensional image based on a second threshold to generate a reconstructed image corresponding to the pins of the electronic component 150. According to an embodiment of the invention, the reconstructed image shows the number of pins of the electronic component 150 and the positions of the pins of the electronic component 150. FIG. 6 is provided for illustration below.

FIG. 6 is a schematic diagram illustrating a reconstructed image according to an embodiment of the invention. As shown in FIG. 6, the image-processing device 140 may set the maximum value (e.g. in the negative film image, the brightest pixel is the pixel which has the maximum value) of the pixels of the two-dimensional image to be the second threshold, and the image-processing device 140 may set the values of the pixels which meet the second threshold to 1, and set the values of the pixels which are smaller than the second threshold to 0. After the binarization process, the image-processing device 140 may generate a reconstructed image that corresponds to the pins of the electronic component. It should be noted that the second threshold may be set to other values according different situations, i.e. the invention should not be limited thereto.

According to an embodiment of the invention, after obtaining the reconstructed image, the image-processing device 140 may determine whether the number of pins of the electronic component shown in the reconstructed image is identical to the number of holes corresponding to the pins of the electronic component on a printed circuit board. When the number of pins of the electronic component shown in the reconstructed image is not identical to the number of holes corresponding to the pins of the electronic component on a printed circuit board, it means that the electronic component may lack some pins or some pins of the electronic component are crooked. As a result, the image-processing device 140 may reject the electronic component. When the number of pins of the electronic component shown in the reconstructed image is identical to the number of holes corresponding to the pins of the electronic component on a printed circuit board, the image-processing device 140 may generate adjustment information according to the reconstructed image, and provide the adjustment information to the gripping device 110. The gripping device 110 may adjust the position and angle of the electronic component according to the adjustment information to ensure that the electronic component is accurately inserted into the printed circuit board.

Figure 7:
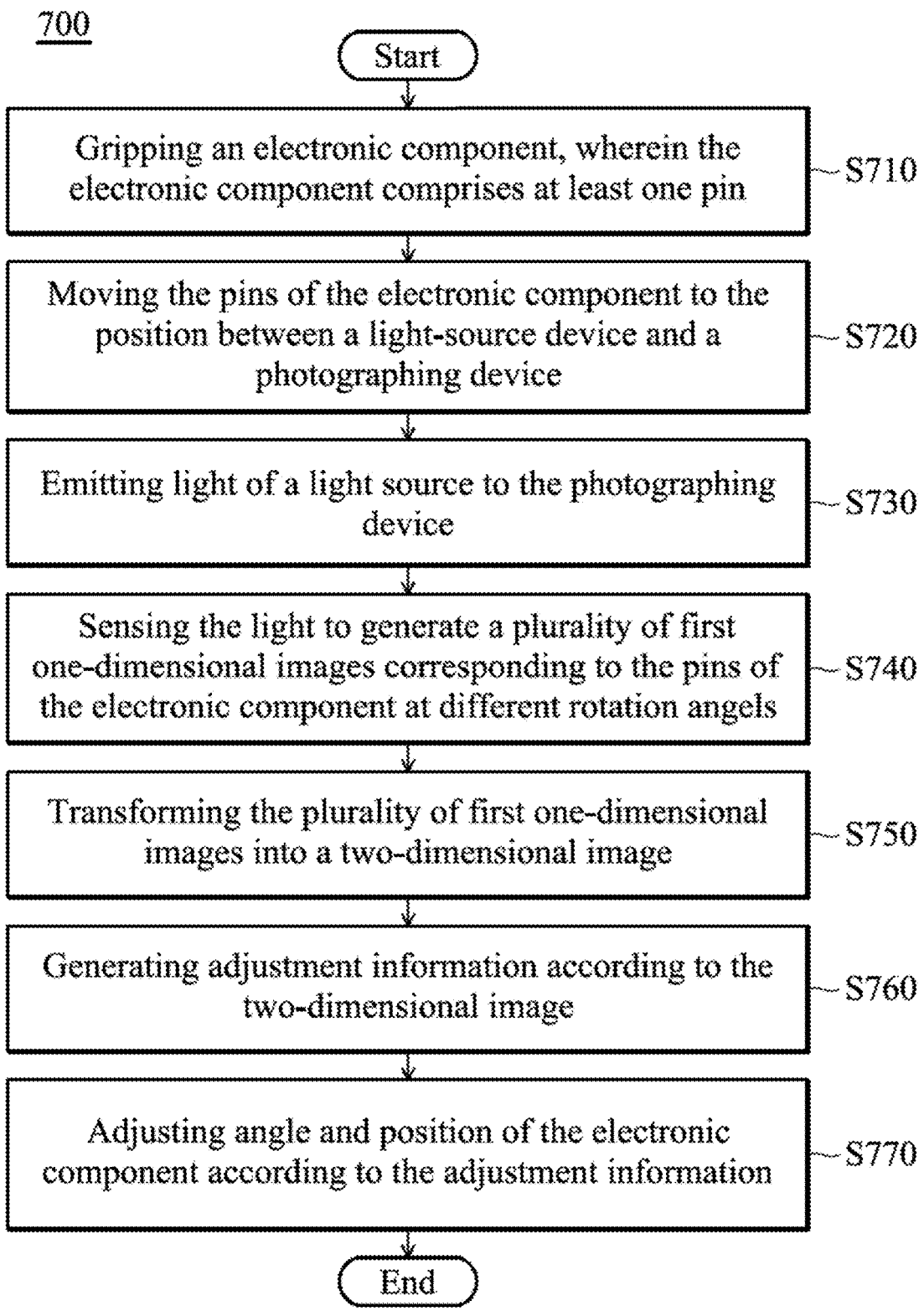
FIG. 7 is a flow chart 700 illustrating a method for assembling electronic components according to an embodiment of the invention.

FIG. 7 is a flow chart 700 illustrating a method for assembling electronic components according to an embodiment of the invention. The method for assembling electronic components is applied to the electronic-component assembly system 100. In step S710, a gripping device of the electronic-component assembly system 100 may grip an electronic component, wherein the electronic component may comprise at least one pin. In step S720, the gripping device may move the electronic component to the position between a light-source device and a photographing device. In step S730, the light-source device may emit the light of the light source to the photographing device. In step S740, the photographing device may sense the light to generate a plurality of first one-dimensional images corresponding to the pins of the electronic component at different rotation angles. In step S750, an image-processing device of the electronic-component assembly system 100 may transform the plurality of first one-dimensional images into a two-dimensional image. In step S760, the image-processing device may generate adjustment information according to the two-dimensional image and provide the adjustment information to the gripping device. In step S770, the gripping device may adjust the position and angle of the electronic component according to the adjustment information.

According to an embodiment of the invention, in step S750, the image-processing device may perform a normalization process on the first one-dimensional images to generate a plurality of normalized images.

According to an embodiment of the invention, in step S750, the image-processing device may perform a first binarization process on the normalized images base on a first threshold.

According to an embodiment of the invention, in step S750, the image-processing device may perform a Fourier transform on the normalized images which have been processed by the binarization process.

According to an embodiment of the invention, in step S750, the image-processing device may generate a two-dimensional spatial frequency distribution diagram according to the images which have been processed by the Fourier transform, and then the processing device may perform an inverse Fourier transform on the two-dimensional spatial frequency distribution diagram to generate a two-dimensional image corresponding to the pins of the electronic component. According to another embodiment of the invention, in step S750, the image-processing device may perform a filter process on the images which have been processed by the Fourier transform, and then the image-processing device 140 may perform an inverse Fourier transform on the filtered images to generate a two-dimensional image, wherein the two-dimensional image may be regarded as a two-dimensional spatial distribution diagram corresponding to the pins of the electronic component. According to another embodiment of the invention, in step S750, the image-processing device may perform an inverse Fourier transform on the images which have been processed by the Fourier transform to generate a two-dimensional image, wherein the two-dimensional image may be regarded as a two-dimensional spatial distribution diagram corresponding to the pins of the electronic component.

According to an embodiment of the invention, in step S750, the image-processing device may perform a second binarization process on the two-dimensional image based on a second threshold to generate a reconstructed image, wherein the reconstructed image shows the number of pins of the electronic component and the positions of the pins of the electronic component.

According to an embodiment of the invention, in step S760, the image-processing device may determine whether the number of pins of the electronic component shown in the reconstructed image is identical to the number of holes corresponding to the pins of the electronic component on a circuit board. When the number of pins of the electronic component shown in the reconstructed image is not identical to the number of holes corresponding to the pins of the electronic component on a printed circuit board, the electronic-component assembly system 100 may reject the electronic component. When the number of pins of the electronic component shown in the reconstructed image is identical to the number of holes corresponding to the pins of the electronic component on a printed circuit board, the electronic-component assembly system 100 may generate adjustment information according to the reconstructed image.

According to an embodiment of the invention, the first one-dimensional images corresponding to the pins of the electronic component at different rotation angles are generated by the gripping device rotating the electronic component or generated by rotating the photographing device to photograph the pins of the electronic component.

According to the method for assembling electronic components of the invention, in the automatic through-hole component assembly, a plurality of the one-dimensional images corresponding to the pins of the electronic component at different rotation angles may be transformed to a two-dimensional image. Therefore, compared to the conventional automatic through-hole component assembly method in which the images generated by photographing device are directly adopted, in the method for assembling electronic components of the invention, the electronic component may be accurately inserted into the printed circuit board. Therefore, the method for assembling electronic components of the invention may effectively increase the yield of the automatic through-hole component assembly and decrease the error rate in the automatic through-hole component assembly.

Use of ordinal terms such as "first", "second", "third", etc., in the disclosure and claims is for description. It does not by itself connote any order or relationship.

The steps of the method described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such that the processor can read information (e.g., code) from and write information to the storage medium. A sample storage medium may be integral to the processor. The processor and the storage medium may reside in an ASIC. The ASIC may reside in user equipment. Alternatively, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

The above paragraphs describe many aspects. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An electronic-component assembly system, comprising:
 a gripping device, gripping an electronic component, wherein the electronic component comprises at least one pin;
 a light-source device, comprising a light source and emitting light of the light source;
 a photographing device, sensing the light, and generating a plurality of first one-dimensional images corresponding to the pins at different rotation angles; and
 an image-processing device, coupled to the photographing device to receive the plurality of first one-dimensional images, wherein the image-processing device transforms the plurality of first one-dimensional images into a two-dimensional image, generates adjustment information according to the two-dimensional image, and provides the adjustment information to the gripping device,
 wherein the gripping device adjusts angle and position of the electronic component according to the adjustment information,
 wherein the image-processing device performs a normalization process on the plurality of first one-dimensional images to generate a plurality of normalized images,
 wherein the image-processing device performs a first binarization process on the plurality of normalized images based on a first threshold,
 wherein the image-processing device performs a Fourier transform on the plurality of normalized images which have been processed by the first binarization process, and
 wherein the image-processing device generates a two-dimensional spatial frequency distribution diagram corresponding to the pins according to the plurality of images which have been processed by the Fourier transform, and performs an inverse Fourier transform on the two-dimensional spatial frequency distribution diagram to generate the two-dimensional image.

2. The electronic-component assembly system of claim 1, wherein the image-processing device performs a second binarization process on the two-dimensional image according to a second threshold to generate a reconstructed image, wherein the reconstructed image shows the number of pins of the electronic component and positions of the pins of the electronic component.

3. The electronic-component assembly system of claim 2, wherein the image-processing device determines whether the number of pins of the electronic component shown in the reconstructed image is identical to the number of holes corresponding to the pins of the electronic component on a circuit board.

4. The electronic-component assembly system of claim 3, wherein when the number of pins of the electronic component shown in the reconstructed image is identical to the number of holes corresponding to the pins of the electronic component on the circuit board, the image-processing device generates adjustment information according to the reconstructed image.

5. The electronic-component assembly system of claim 1, wherein the plurality of first one-dimensional images corresponding to the pins of the electronic component at different rotation angles are generated by the gripping device rotating the electronic component.

6. The electronic-component assembly system of claim 1, wherein the plurality of first one-dimensional images corresponding to the pins of the electronic component at different rotation angles are generated by rotating the photographing device to photograph the pins of the electronic component.

7. The electronic-component assembly system of claim 1, wherein the electronic-component assembly system is applied to a moving carrier.

8. The electronic-component assembly system of claim 1, wherein the gripping device, the light-source device, and the photographing device are configured on a moving carrier, and the image-processing device is configured on a machine station.

9. The electronic-component assembly system of claim 1, wherein the gripping device is configured on a moving carrier, and the light-source device, the photographing device, and the image-processing device are configured on a machine station.

10. A method for assembling electronic components, comprising:
gripping an electronic component, wherein the electronic component comprises at least one pin;
moving the pins of the electronic component between a light-source device and a photographing device;
emitting light of a light source to the photographing device;
sensing the light to generate a plurality of first one-dimensional images corresponding to the pins of the electronic component at different rotation angles;
performing a normalization process on the plurality of first one-dimensional images to generate a plurality of normalized images;
performing a first binarization process on the plurality of normalized images based on a first threshold;
performing a Fourier transform on the plurality of normalized images which have been processed by the first binarization process;
generating a two-dimensional spatial frequency distribution diagram corresponding to the pins according to the plurality of images which have been processed by the Fourier transform;
performing an inverse Fourier transform on the two-dimensional spatial frequency distribution diagram to generate a two-dimensional image;
generating adjustment information according to the two-dimensional image; and
adjusting angle and position of the electronic component according to the adjustment information.

11. An electronic-component assembly system, comprising:
a gripping device, gripping an electronic component, wherein the electronic component comprises at least one pin;
a light-source device, comprising a light source and emitting light of the light source;
a photographing device, sensing the light, and generating a plurality of first one-dimensional images corresponding to the pins at different rotation angles; and
an image-processing device, coupled to the photographing device to receive the plurality of first one-dimensional images, wherein the image-processing device transforms the plurality of first one-dimensional images into a two-dimensional image, generates adjustment information according to the two-dimensional image, and provides the adjustment information to the gripping device,
wherein the gripping device adjusts angle and position of the electronic component according to the adjustment information,
wherein the image-processing device performs a normalization process on the plurality of first one-dimensional images to generate a plurality of normalized images,
wherein the image-processing device performs a first binarization process on the plurality of normalized images based on a first threshold,
wherein the image-processing device performs a Fourier transform on the plurality of normalized images which have been processed by the first binarization process, and
wherein the image-processing device performs an inverse Fourier transform directly on the plurality of images which have been processed by the Fourier transform to generate a plurality of two-dimensional spatial distribution diagrams, and the image-processing device generates the two-dimensional image according to the two-dimensional spatial distribution diagrams.

12. The electronic-component assembly system of claim 11, wherein the image-processing device performs a second binarization process on the two-dimensional image according to a second threshold to generate a reconstructed image, wherein the reconstructed image shows the number of pins of the electronic component and positions of the pins of the electronic component.

13. The electronic-component assembly system of claim 12, wherein the image-processing device determines whether the number of pins of the electronic component shown in the reconstructed image is identical to the number of holes corresponding to the pins of the electronic component on a circuit board.

14. The electronic-component assembly system of claim 13, wherein when the number of pins of the electronic component shown in the reconstructed image is identical to the number of holes corresponding to the pins of the electronic component on the circuit board, the image-processing device generates adjustment information according to the reconstructed image.

15. The electronic-component assembly system of claim 11, wherein the plurality of first one-dimensional images corresponding to the pins of the electronic component at different rotation angles are generated by the gripping device rotating the electronic component.

16. The electronic-component assembly system of claim 11, wherein the plurality of first one-dimensional images corresponding to the pins of the electronic component at different rotation angles are generated by rotating the photographing device to photograph the pins of the electronic component.

17. The electronic-component assembly system of claim 11, wherein the electronic-component assembly system is applied to a moving carrier.

18. The electronic-component assembly system of claim 11, wherein the gripping device, the light-source device, and the photographing device are configured on a moving carrier, and the image-processing device is configured on a machine station.

19. The electronic-component assembly system of claim 11, wherein the gripping device is configured on a moving carrier, and the light-source device, the photographing device, and the image-processing device are configured on a machine station.

* * * * *